United States Patent
Lin et al.

(10) Patent No.: US 11,121,261 B2
(45) Date of Patent: Sep. 14, 2021

(54) SEMICONDUCTOR SUBSTRATE

(71) Applicant: Au Optronics Corporation, Hsinchu (TW)

(72) Inventors: Wei-Ting Lin, Hsinchu (TW); Dean Wang, Hsinchu (TW); Chun-Cheng Cheng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/783,045

(22) Filed: Feb. 5, 2020

(65) Prior Publication Data

US 2021/0005750 A1 Jan. 7, 2021

(30) Foreign Application Priority Data

Jul. 3, 2019 (TW) .................................. 108123501

(51) Int. Cl.
*H01L 27/00* (2006.01)
*H01L 29/00* (2006.01)
(Continued)

(52) U.S. Cl.
CPC ...... *H01L 29/7869* (2013.01); *H01L 27/1225* (2013.01); *H01L 29/24* (2013.01);
(Continued)

(58) Field of Classification Search
CPC .............. H01L 25/167; H01L 25/0657; H01L 25/0652; H01L 25/074; H01L 25/50;
(Continued)

(56) References Cited

U.S. PATENT DOCUMENTS 8,384,076 B2 * 2/2013 Park .................. H01L 29/66969
257/43
8,890,156 B2 * 11/2014 Yeh ..................... H01L 27/1251
257/59
(Continued)

FOREIGN PATENT DOCUMENTS

CN 100449716 1/2009
CN 102184968 9/2011
(Continued)

OTHER PUBLICATIONS

J. Y. Chen, "CMOS Devices and Technology for VLSI", Jan. 1990, p. 148.

*Primary Examiner* — Nikolay K Yushin
(74) *Attorney, Agent, or Firm* — JCIPRNET (57) ABSTRACT

A semiconductor substrate includes a substrate, a first metal oxide semiconductor layer, a first insulating layer, a first conductive layer, a second insulating layer, a second conductive layer, and a second metal oxide semiconductor layer. The first transistor includes a first metal oxide semiconductor pattern of the first metal oxide semiconductor layer, a first gate of the first conductive layer, a first source of the second conductive layer, and a first drain of the second conductive layer. The second transistor includes a second metal oxide semiconductor pattern of the first metal oxide semiconductor layer, a second gate of the first conductive layer, a second source of the second conductive layer, a second drain of the second conductive layer, and a third metal oxide semiconductor pattern of the second metal oxide semiconductor layer.

22 Claims, 8 Drawing Sheets

(51) Int. Cl.
*H01L 33/00* (2010.01)
*H01L 29/786* (2006.01)
*H01L 27/12* (2006.01)
*H01L 29/24* (2006.01)
*H01L 29/66* (2006.01)
*H01L 33/62* (2010.01)

(52) U.S. Cl.
CPC .. *H01L 29/66969* (2013.01); *H01L 29/78633* (2013.01); *H01L 29/78696* (2013.01); *H01L 33/62* (2013.01)

(58) Field of Classification Search
CPC . H01L 27/156; H01L 27/1225; H01L 27/124; H01L 27/1248; H01L 29/66969; H01L 29/78696; H01L 29/7869; H01L 29/78633; H01L 29/24; H01L 33/62; H01L 33/20; H01L 33/486; H01L 33/647
See application file for complete search history.

(56) References Cited

U.S. PATENT DOCUMENTS

| | | | |
|---|---|---|---|
| 9,768,203 B2 | 9/2017 | Han et al. | |
| 10,256,429 B2* | 4/2019 | Jung | H01L 27/3276 |
| 2007/0072439 A1 | 3/2007 | Akimoto et al. | |
| 2009/0283763 A1* | 11/2009 | Park | H01L 29/66969 |
| | | | 257/43 |
| 2011/0156024 A1 | 6/2011 | Koyama et al. | |
| 2013/0240886 A1* | 9/2013 | Yeh | H01L 27/1251 |
| | | | 257/57 |
| 2013/0264563 A1 | 10/2013 | Okazaki et al. | |
| 2016/0315104 A1 | 10/2016 | Han et al. | |
| 2018/0190931 A1* | 7/2018 | Jung | H01L 27/1244 |

FOREIGN PATENT DOCUMENTS

| | | |
|---|---|---|
| CN | 202013886 | 10/2011 |
| CN | 104900653 | 9/2015 |
| CN | 108269855 | 7/2018 |
| TW | 201338102 | 9/2013 |

* cited by examiner

SEMICONDUCTOR SUBSTRATE

CROSS-REFERENCE TO RELATED APPLICATION

This application claims the priority benefit of Taiwan application serial no. 108123501, filed on Jul. 3, 2019. The entirety of the above-mentioned patent application is hereby incorporated by reference herein and made a part of this specification.

BACKGROUND OF THE INVENTION

Field of the Invention

The invention relates to a semiconductor substrate, and more particularly, to a semiconductor substrate having a plurality of transistors.

Description of Related Art

In recent years, the application of various display devices has developed rapidly, and the thin-film transistor is a semiconductor element widely used in display techniques, such as: liquid crystal displays (LCD), organic light-emitting diode (OLED) displays, μLED (mini-LED) displays, and electronic papers (E-paper).

The thin-film transistors currently used in the industry may be differentiated according to the material of the semiconductor layer used, including amorphous silicon thin-film transistors (a-Si TFTs), polysilicon TFTs, and metal oxide semiconductor TFTs. Among them, the metal oxide semiconductor material of the metal oxide semiconductor thin-film transistor generally has an amorphous structure, and therefore the issue of poor uniformity in large-sized panel applications is less likely, and film forming may be achieved by various methods such as sputtering, spin-on, and inkjet printing. Since the carrier mobility of the metal oxide semiconductor thin-film transistor may be several times higher than that of an amorphous silicon thin-film transistor and the metal oxide semiconductor thin-film transistor has the above process advantages, there are currently some products on the market that use the metal oxide semiconductor thin-film transistor.

However, although the carrier mobility of the metal oxide semiconductor thin-film transistor is high, limits still exist. When the metal oxide semiconductor thin-film transistor is applied to a specific circuit and needs to provide a high current output, the layout area of the metal oxide semiconductor thin-film transistor needs to be increased. As a result, design of pixel layouts for high-resolution displays is difficult.

SUMMARY OF THE INVENTION

The invention provides a semiconductor substrate having good performance.

A semiconductor substrate of an embodiment of the invention includes a substrate, a first metal oxide semiconductor layer, a first insulating layer, a first conductive layer, a second insulating layer, a second conductive layer, and a second metal oxide semiconductor layer. The first metal oxide semiconductor layer is disposed on the substrate. The first metal oxide semiconductor layer includes a first metal oxide semiconductor pattern and a second metal oxide semiconductor pattern. The first insulating layer is disposed on the first metal oxide semiconductor layer. The first conductive layer is disposed on the first insulating layer. The first conductive layer includes a first gate and a second gate. The second insulating layer is disposed on the first conductive layer. The second conductive layer is disposed on the second insulating layer. The second conductive layer includes a first source, a first drain, a second source, and a second drain. The first source and the first drain are each electrically connected to the first metal oxide semiconductor pattern of the first metal oxide semiconductor layer. The first transistor includes the first metal oxide semiconductor pattern, the first gate, the first source, and the first drain. The second source and the second drain are each electrically connected to the second metal oxide semiconductor pattern of the first metal oxide semiconductor layer. The second metal oxide semiconductor layer is disposed on the second insulating layer. The second metal oxide semiconductor layer includes a third metal oxide semiconductor pattern. The second source and the second drain are each electrically connected to the third metal oxide semiconductor pattern of the second metal oxide semiconductor layer. The second transistor includes the second metal oxide semiconductor pattern of the first metal oxide semiconductor layer, the second gate, the second source, the second drain, and the third metal oxide semiconductor pattern of the second metal oxide semiconductor layer. In particular, the first source of the first transistor and the first gate of the first transistor are not overlapped, the first drain of the first transistor and the first gate of the first transistor are not overlapped, the second source of the second transistor and the second gate of the second transistor are partially overlapped, and the second drain of the second transistor and the second gate of the second transistor are partially overlapped.

A semiconductor substrate of an embodiment of the invention includes a substrate, a first transistor, and a second transistor. The first transistor is disposed on the substrate. The first transistor has a first metal oxide semiconductor pattern, a first gate, a first source, and a first drain, and the first source and the first drain are each electrically connected to the first metal oxide semiconductor pattern. The second transistor is disposed on the substrate. The second transistor has a second metal oxide semiconductor pattern, a first insulating layer, a second gate, a second insulating layer, a second source, a second drain, and a third metal oxide semiconductor pattern. The first insulating layer is disposed on the second metal oxide semiconductor pattern. The second gate is disposed on the first insulating layer. The second insulating layer is disposed on the second gate. The second source, the second drain, and the third metal oxide semiconductor pattern are disposed on the second insulating layer. The second source and the second drain are each electrically connected to the second metal oxide semiconductor pattern, and the second source and the second drain are each electrically connected to the third metal oxide semiconductor pattern. The first drain of the first transistor is electrically connected to the second gate of the second transistor.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Hereinafter, exemplary embodiments of the invention are described in detail, and examples of the exemplary embodiments are conveyed via the figures. Wherever possible, the same reference numerals are used in the figures and the descriptions to refer to the same or similar portions.

It should be understood that, when a layer, film, region, or an element of a substrate is "on" another element or "connected to" another element, the element may be directly on the other element or connected to the other element, or an intermediate element may also be present. On the other hand, when an element is "directly on another element" or "directly connected to" another element, an intermediate element is not present. As used in the present specification, "connected to" may refer to a physical and/or electrical connection. Furthermore, "electrically connected" or "coupled" may mean that other elements are present between two elements.

"About", "similar", or "substantially" used in the present specification include the value and the average value within an acceptable deviation range of a specific value confirmed by those having ordinary skill in the art, and the concerned measurement and a specific quantity (i.e., limitations of the measuring system) of measurement-related errors are taken into consideration. For instance, "about" may represent within one or a plurality of standard deviations of the value, or within ±30%, ±20%, ±10%, or ±5%. Moreover, "about", "similar", or "substantially" used in the present specification may include a more acceptable deviation range or standard deviation according to optical properties, etching properties, or other properties, and one standard deviation does not need to apply to all of the properties.

Unless otherwise stated, all of the terminology used in the present specification (including technical and scientific terminology) have the same definition as those commonly understood by those skilled in the art of the invention. It should be further understood that, terminology defined in commonly-used dictionaries should be interpreted to have the same definitions in related art and in the entire specification of the invention, and are not interpreted as ideal or overly-formal definitions unless clearly stated as such in the present specification.

FIG. 1A to FIG. 1F are cross-sectional views of a manufacturing process of a semiconductor substrate of an embodiment of the invention.

Figure 1A:
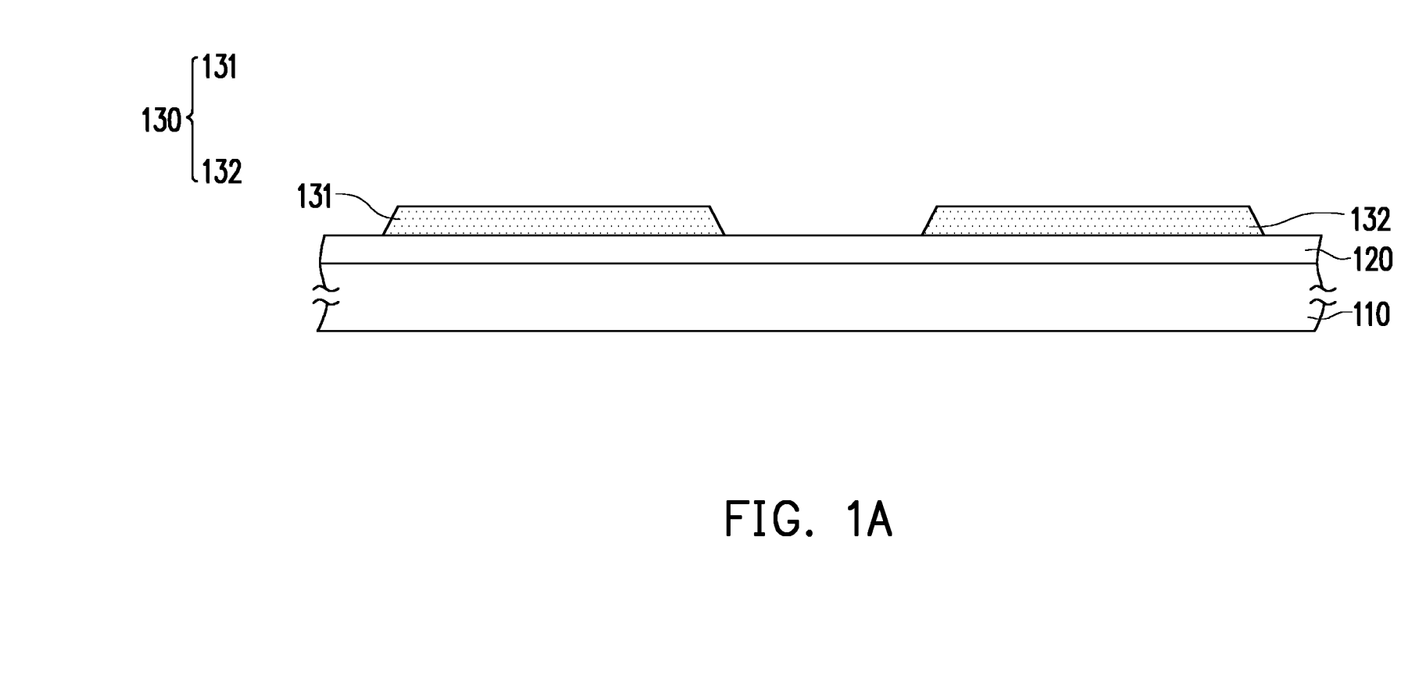
FIG. 1A to FIG. 1F are cross-sectional views of a manufacturing process of a semiconductor substrate of an embodiment of the invention.

Referring first to FIG. 1A, first, a substrate 110 is provided. The substrate 110 is mainly used to carry elements of a semiconductor substrate 100 (labeled in FIG. 1F). For example, in the present embodiment, the material of the substrate 110 may be glass, quartz, organic polymer, or an opaque/reflective material (such as conductive material, wafer, ceramic, or other applicable materials), or other applicable materials.

Referring to FIG. 1A, next, a buffer layer 120 may be optionally formed on the substrate 110. However, the invention is not limited thereto, and the buffer layer 120 may also be omitted according to other embodiments.

Referring to FIG. 1A, next, a first metal oxide semiconductor layer 130 is formed on the substrate 110. The first metal oxide semiconductor layer 130 includes a first metal oxide semiconductor pattern 131 and a second metal oxide semiconductor pattern 132 spaced from each other.

For example, in the present embodiment, the material of the first metal oxide semiconductor layer 130 may be indium gallium zinc oxide (IGZO). However, the invention is not limited thereto. According to other embodiments, the material of the first metal oxide semiconductor layer 130 may also be other metal oxide semiconductors, such as but not limited to: indium tin zinc oxide (ITZO), ZnO, SnO, indium zinc oxide (IZO), gallium zinc oxide (GZO), zinc tin oxide (ZTO), or indium tin oxide (ITO).

Figure 1B:
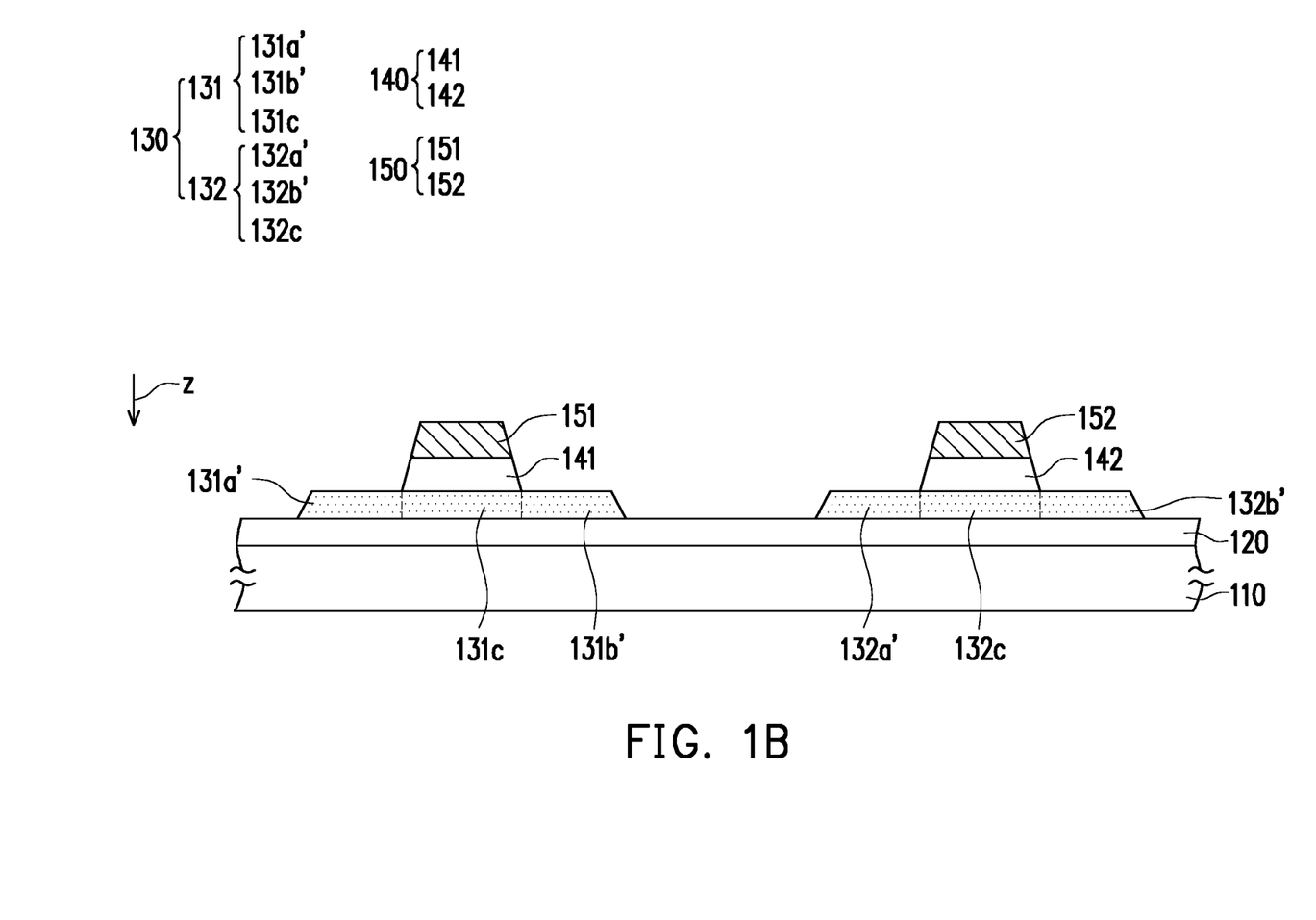

Referring to FIG. 1B, next, a first insulating layer 140 and a first conductive layer 150 are formed on the first metal oxide semiconductor layer 130. The first insulating layer 140 is disposed on the first metal oxide semiconductor layer 130. The first insulating layer 140 includes a first insulating pattern 141 and a second insulating pattern 142 spaced from each other and respectively disposed on the first metal oxide semiconductor pattern 131 and the second metal oxide semiconductor pattern 132. The first conductive layer 150 is disposed on the first insulating layer 140. The first conductive layer 150 includes a first gate 151 and a second gate 152 spaced from each other and respectively disposed on the first insulating pattern 141 and the second insulating pattern 142.

The first metal oxide semiconductor pattern 131 has a source predetermined region 131$a'$, a drain predetermined region 131$b'$, and a channel region 131$c$, wherein the first gate 151 shields the channel region 131$c$, the first gate 151 does not shield the source predetermined region 131$a'$ and the drain predetermined region 131$b'$, and the channel region 131$c$ is connected between the source predetermined region 131$a'$ and the drain predetermined region 131$b'$. The second metal oxide semiconductor pattern 132 has a source predetermined region 132$a'$, a drain predetermined region 132$b'$, and a channel region 132$c$, wherein the second gate 152 shields the channel region 132$c$, the second gate 152 does not shield the source predetermined region 132$a'$ and the drain predetermined region 132$b'$, and the channel region 132$c$ is connected between the source predetermined region 132$a'$ and the drain predetermined region 132$b'$.

For example, in the present embodiment, the first conductive layer 150 and the first insulating layer 140 may be formed by using a photoresist layer (not shown) as a mask, so that the first conductive layer 150 and the first insulating layer 140 may achieve a self-aligned effect in a vertical projection direction z. That is, in the present embodiment, the first gate 151 and the second gate 152 may be aligned with the first insulating pattern 141 and the second insulating pattern 142 respectively, but the invention is not limited thereto.

In the present embodiment, the material of the first insulating layer 140 may be an inorganic material (for example, silicon oxide, silicon nitride, silicon oxynitride, or stacked layers of at least two of the above materials), an organic material, or a combination thereof.

In the present embodiment, based on considerations of conductivity, the material of the first conductive layer 150 may be a metal. However, the invention is not limited thereto. According to other embodiments, the material of the first conductive layer 150 may be other conductive materials. Examples include alloy, nitride of a metal material, oxide of a metal material, oxynitride of a metal material, and stacked layers of metal materials and other conductive materials.

Figure 1C:
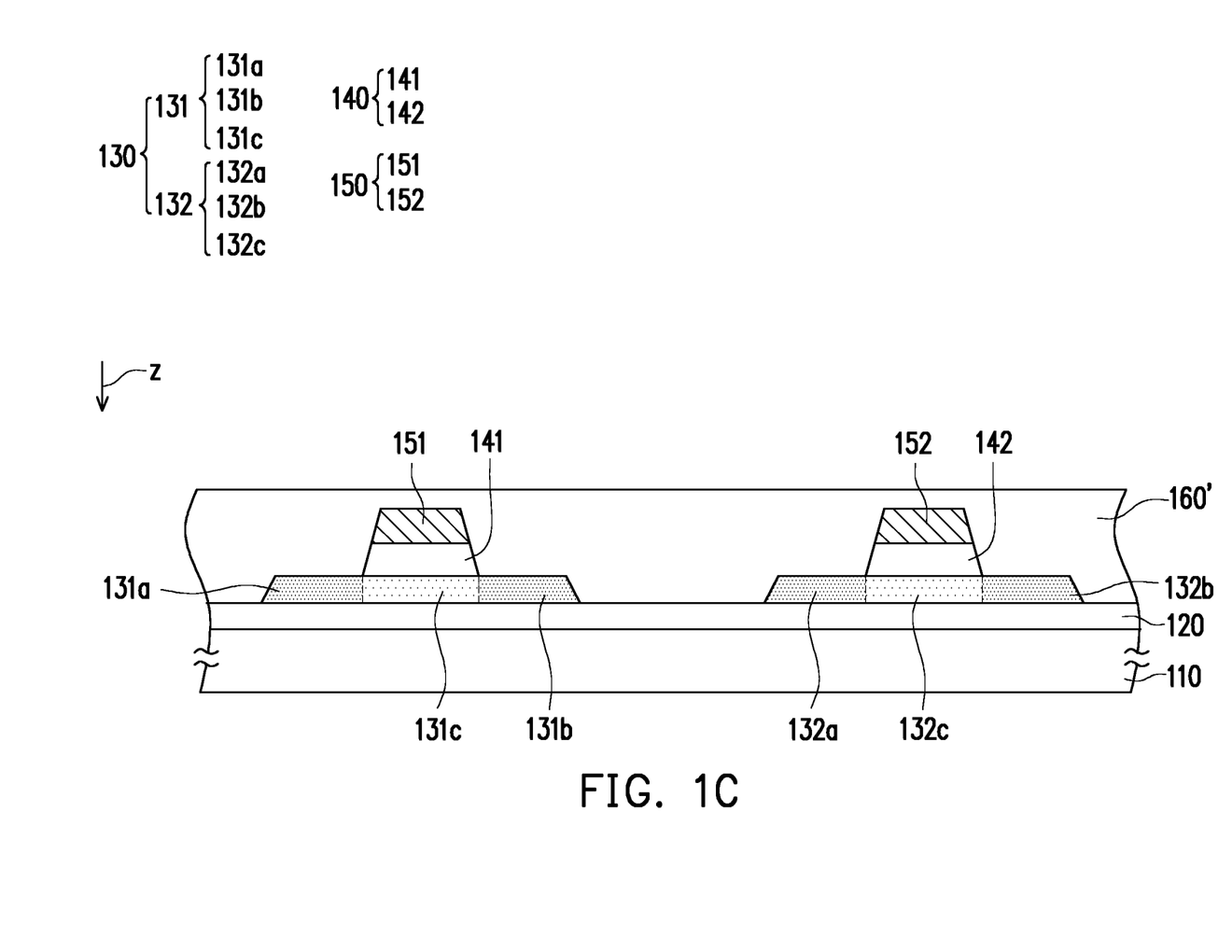

Referring to FIG. 1C, next, a second insulating material layer 160' is formed to cover the first conductive layer 150, the first insulating layer 140, and the first metal oxide semiconductor layer 130.

Please refer to FIG. 1B and FIG. 1C. In the present embodiment, when the second insulating material layer 160' is formed, the first metal oxide semiconductor layer 130 may be subjected to a local modification process at the same time to reduce the resistance of the source predetermined region 131*a*', the drain predetermined region 131*b*', the source predetermined region 132*a*', and the drain predetermined region 132*b*' and change the source predetermined region 131*a*', the drain predetermined region 131*b*', the source predetermined region 132*a*', and the drain predetermined region 132*b*' into a source region 131*a*, a drain region 131*b*, a source region 132*a*, and a drain region 132*b*, respectively.

For example, in the present embodiment, the second insulating material layer 160' may be silicon nitride containing hydrogen. When the second insulating material layer 160' is in contact with the first metal oxide semiconductor layer 130, the hydrogen in the second insulating material layer 160' increases the carrier concentration in the first metal oxide semiconductor layer 130, so that portions in which the first metal oxide semiconductor layer 130 is in contact with the second insulating material layer 160' (that is, the source predetermined region 131*a*', the drain predetermined region 131*b*', the source predetermined region 132*a*', and the drain predetermined region 132*b*') are changed into the source region 131*a*, the drain region 131*b*, the source region 132*a*, and the drain region 132*b* similar to a conductor.

In other words, in the present embodiment, the portions in which the first metal oxide semiconductor layer 130 is in contact with the second insulating material layer 160' (that is, the source region 131*a*, the drain region 131*b*, the source region 132*a*, and the drain region 132*b*) are modified regions and have lower resistivity, and the portions in which the first metal oxide semiconductor layer 130 is not in contact with the second insulating material layer 160' (that is, the channel region 131*c* and the channel region 132*c*) are intrinsic regions and have higher resistivity and semiconductor characteristics.

However, the invention is not limited thereto. According to other embodiments, other methods may also be used to respectively change the source predetermined region 131*a*', the drain predetermined region 131*b*', the source predetermined region 132*a*', and the drain predetermined region 132*b*' into the source region 131*a*, the drain region 131*b*, the source region 132*a*, and the drain region 132*b* similar to a conductor.

For example, in another embodiment, after the first metal oxide semiconductor layer 130, the first insulating layer 140, and the first conductive layer 150 of FIG. 1B are formed and before the second insulating material layer 160' of FIG. 1C is formed, ammonia gas ($NH_3$) or hydrogen gas ($H_2$) or an inert gas may be introduced for a plasma treatment process. The plasma treatment process helps to increase the carrier concentration of the source predetermined region 131*a*', the drain predetermined region 131*b*', the source predetermined region 132*a*', and the drain predetermined region 132*b*', thereby reducing the resistance of the source predetermined region 131*a*', the drain predetermined region 131*b*', the source predetermined region 132*a*', and the drain predetermined region 132*b*' so the source predetermined region 131*a*', the drain predetermined region 131*b*', the source predetermined region 132*a*', and the drain predetermined region 132*b*' are respectively changed into the source region 131*a*, the drain region 131*b*, the source region 132*a*, and the drain region 132*b* similar to a conductor.

Figure 1D:
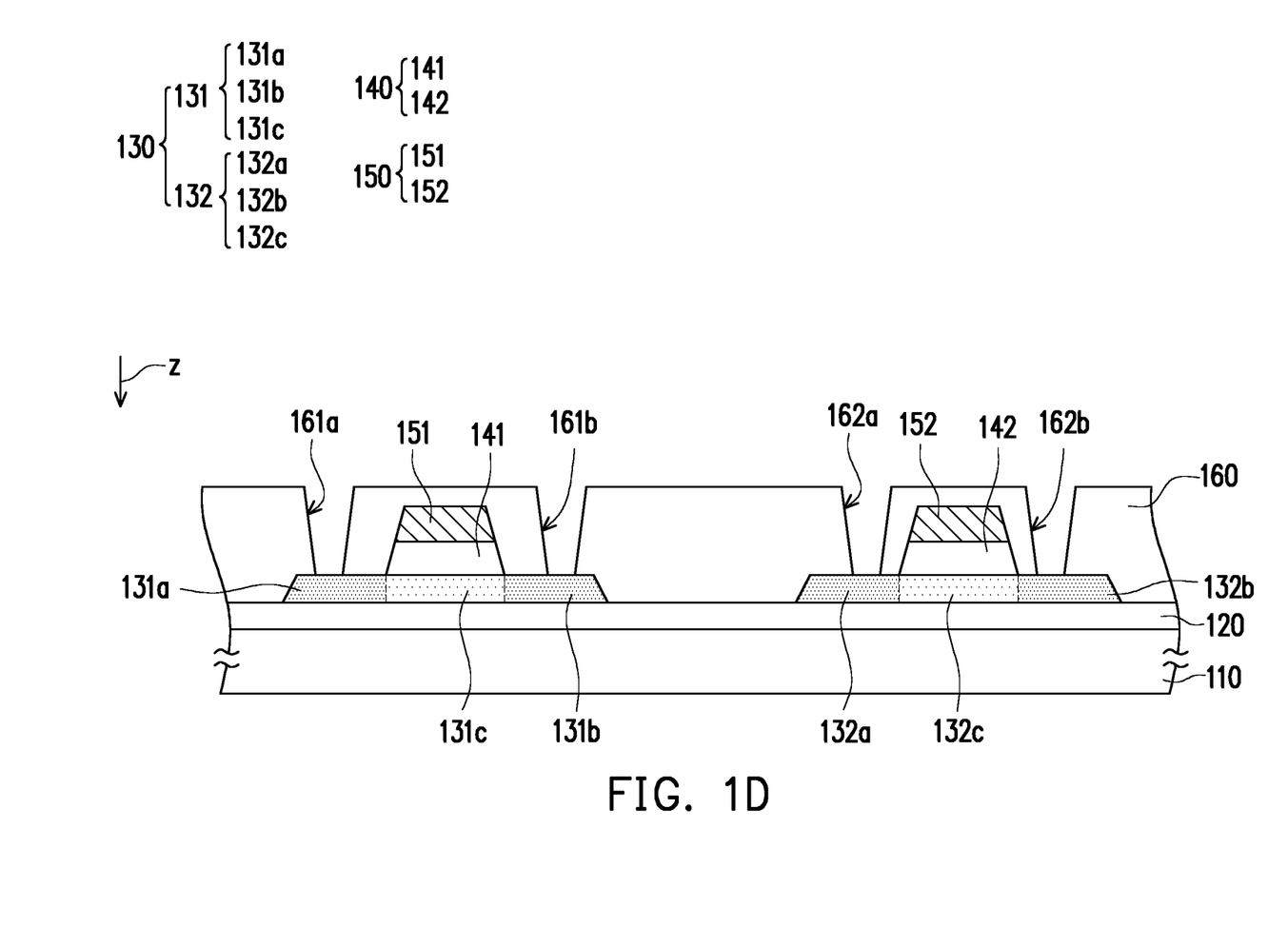

Referring to FIG. 1C and FIG. 1D, next, the second insulating material layer 160' is patterned to form the second insulating layer 160. The second insulating layer 160 is disposed on the first conductive layer 150 and has a contact 161*a*, a contact 161*b*, a contact 162*a*, and a contact 162*b*. The contact 161*a*, the contact 161*b*, the contact 162*a*, and the contact 162*b* respectively expose the source region 131*a*, the drain region 131*b*, the source region 132*a*, and the drain region 132*b*.

Figure 1E:
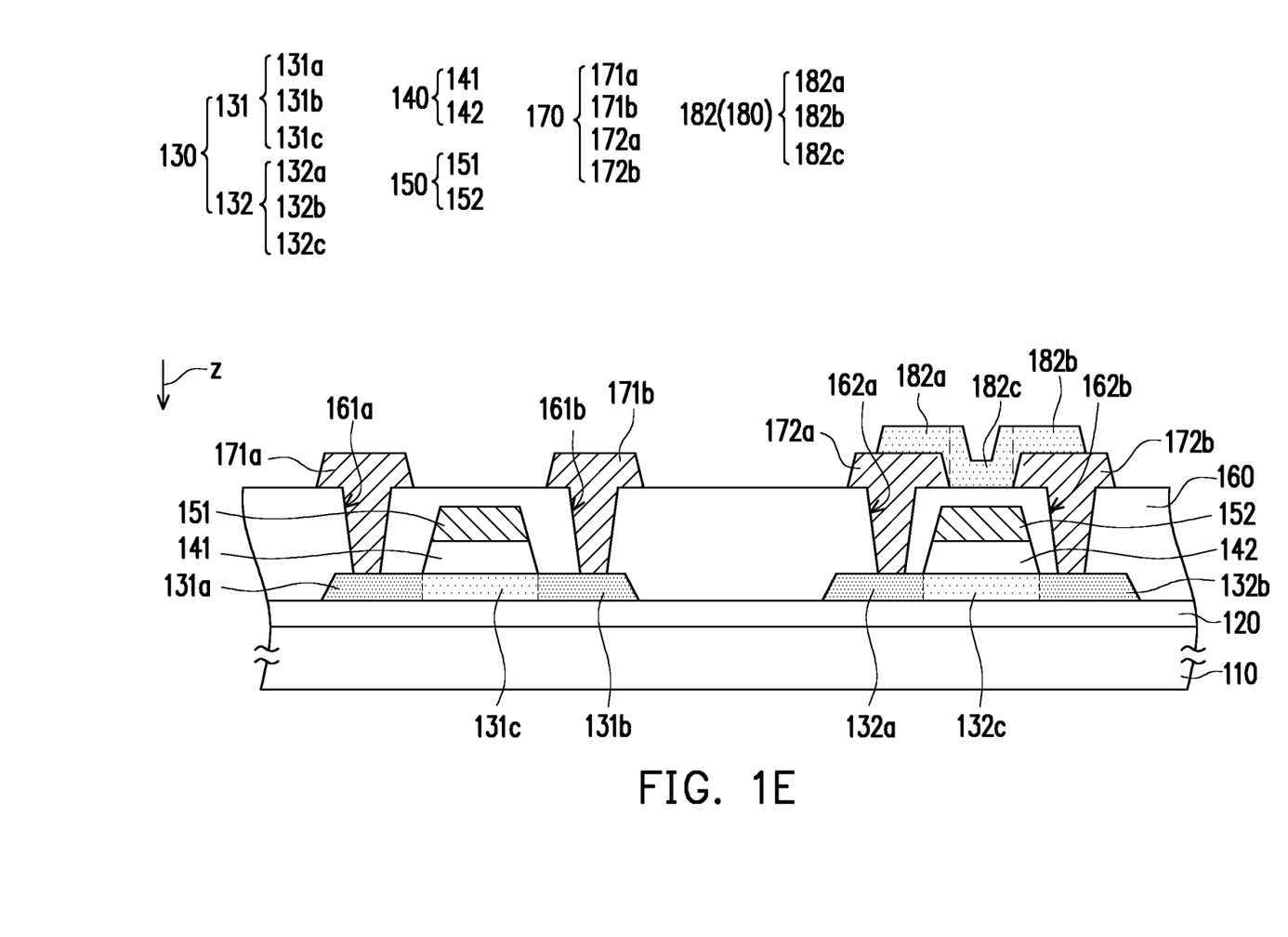

Referring to FIG. 1E, next, a second conductive layer 170 is formed on the second insulating layer 160. The second conductive layer 170 is disposed on the second insulating layer 160. The second conductive layer 170 includes a first source 171*a*, a first drain 171*b*, a second source 172*a*, and a second drain 172*b*. The first source 171*a* and the first drain 171*b* are electrically connected to the source region 131*a* and the drain region 131*b* of the first metal oxide semiconductor pattern 131 via the contact 161*a* and the contact 161*b* of the second insulating layer 160, respectively. The first source 171*a* and the first drain 171*b* are directly in contact with the source region 131*a* and the drain region 131*b* of the first metal oxide semiconductor pattern 131, respectively. The channel layer 131*c* of the first metal oxide semiconductor pattern 131 is disposed between the source region 131*a* of the first metal oxide semiconductor pattern 131 and the drain region 131*b* of the first metal oxide semiconductor pattern 131.

Similarly, the second source 172*a* and the second drain 172*b* are each electrically connected to the source region 132*a* and the drain region 132*b* of the second metal oxide semiconductor pattern 132 via the contact 162*a* and the contact 162*b* of the second insulating layer 160. The second source 172*a* and the second drain 172*b* are directly in contact with the source region 132*a* and the drain region 132*b* of the second metal oxide semiconductor pattern 132, respectively. The channel layer 132*c* of the second metal oxide semiconductor pattern 132 is disposed between the source region 132*a* of the second metal oxide semiconductor pattern 132 and the drain region 132*b* of the second metal oxide semiconductor pattern 132.

In the present embodiment, based on considerations of conductivity, the material of the second conductive layer 170 may be a metal. However, the invention is not limited thereto. According to other embodiments, the material of the second conductive layer 170 may be other conductive materials. Examples include alloy, nitride of a metal material, oxide of a metal material, oxynitride of a metal material, and stacked layers of metal materials and other conductive materials.

Referring to FIG. 1E, next, a second metal oxide semiconductor layer 180 is formed on the second conductive layer 170. The second metal oxide semiconductor layer 180 includes a third metal oxide semiconductor pattern 182. The third metal oxide semiconductor pattern 182 has a source region 182*a*, a channel region 182*c*, and a drain region 182*b*. The source region 182*a* of the third metal oxide semiconductor pattern 182 is directly in contact with the second source 172*a*, the drain region 182*b* of the third metal oxide semiconductor pattern 182 is directly in contact with the second drain 172*b*, and the channel region 182*c* of the third metal oxide semiconductor pattern 182 is disposed between the source region 182*a* of the third metal oxide semiconductor pattern 182 and the drain region 182b of the third metal oxide semiconductor pattern 182.

In the present embodiment, the second metal oxide semiconductor layer 180 may not be subjected to a local modification process like the aforementioned first metal oxide semiconductor layer 130, and the source region 182a, the channel region 182c, and the drain region 182b of the third metal oxide semiconductor pattern 182 may all be intrinsic regions. The resistivity of the source region 182a and the drain region 182b of the third metal oxide semiconductor pattern 182 is greater than the resistivity of the source region 132a and the drain region 132b of the second metal oxide semiconductor pattern 132. The resistivity of the source region 182a and the drain region 182b of the third metal oxide semiconductor pattern 182 is greater than the resistivity of the source region 131a and the drain region 131b of the first metal oxide semiconductor pattern 131.

In the present embodiment, the material of the second metal oxide semiconductor layer 180 and the material of the first metal oxide semiconductor layer 130 may optionally be different. Preferably, the carrier mobility of the second metal oxide semiconductor layer 180 may be greater than the carrier mobility of the first metal oxide semiconductor layer 130. For example, in the present embodiment, the material of the second metal oxide semiconductor layer 180 may be indium tin zinc oxide (ITZO). However, the invention is not limited thereto. According to other embodiments, the material of the second metal oxide semiconductor layer 180 may also be other metal oxide semiconductors, such as but not limited to: indium gallium zinc oxide (IGZO), ZnO, SnO, indium zinc oxide (IZO), gallium zinc oxide (GZO), zinc tin oxide (ZTO), or indium tin oxide (ITO).

Figure 1F:
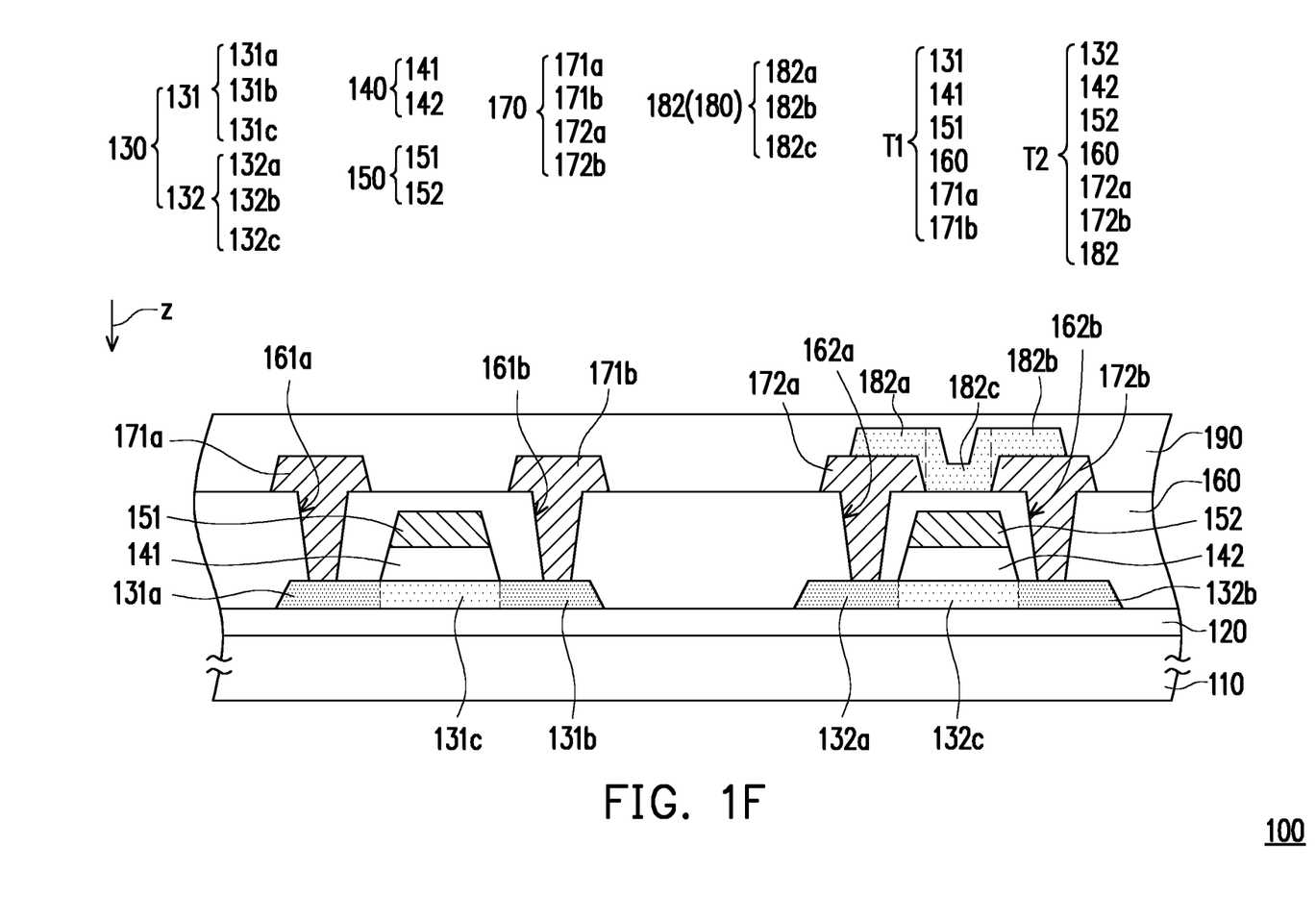

Referring to FIG. 1F, next, a third insulating layer 190 is formed to cover the second metal oxide semiconductor layer 180, the second conductive layer 170, and the second insulating layer 160. In the present embodiment, the material of the third insulating layer 190 may be an inorganic material (for example, silicon oxide, silicon nitride, silicon oxynitride, or stacked layers of at least two of the above materials), an organic material, or a combination thereof. Here, the semiconductor substrate 100 of the present embodiment is completed.

Referring to FIG. 1F, the semiconductor substrate 100 has a first transistor T1 and a second transistor T2. The first transistor T1 may be formed by the first metal oxide semiconductor pattern 131, the first insulating pattern 141, the first gate 151, the second insulating layer 160, the first source 171a, and the first drain 171b above. The second transistor T2 may be formed by the second metal oxide semiconductor pattern 132, the first insulating pattern 141, the second gate 152, the second insulating layer 160, the second source 172a, the second drain 172b, and the third metal oxide semiconductor pattern 182.

It is worth mentioning that the second transistor T2 includes two semiconductor patterns (i.e., the second semiconductor pattern 132 and the third semiconductor pattern 182), and the two semiconductor patterns share the same set of source and drain (i.e., the second source 172a and the second drain 172b). That is, the second transistor T2 includes two sub-transistors. One of the sub-transistors is formed by the second semiconductor pattern 132, the second insulating pattern 142, the second gate 152, the second insulating layer 160, the second source 172a, and the second drain 172b, and the other sub-transistor is formed by the second gate 152, the second insulating layer 160, the second source 172a, the second drain 172b, and the third semiconductor pattern 182, and the two sub-transistors are connected in parallel. Thereby, the second transistor T2 may provide a high current output (such as, but not limited to, twice the current output that one sub-transistor may provide). In addition, since the two semiconductor patterns (i.e., the second semiconductor pattern 132 and the third semiconductor pattern 182) of the second transistor T2 are stacked on top of each other, the second transistor T2 does not need to occupy more layout area while achieving high current output, thus contributing to the aperture ratio of the semiconductor substrate 100.

Furthermore, in the present embodiment, the second source 172a of the second transistor T2 and the second gate 152 of the second transistor T2 are partially overlapped, and the second drain 172b of the second transistor T2 and the second gate 152 of the second transistor T2 are partially overlapped. That is, a portion of the third metal oxide semiconductor pattern 182 located between the second source 172a and the second drain 172b (i.e., the channel region 182c) is located within the area of the second gate 152. Accordingly, even if the source region 182a and the drain region 182b of the third metal oxide semiconductor pattern 182 of the second transistor T2 are not modified and have a high resistivity, the second gate 152 may still effectively control the carriers in the channel region 182c, so that the second transistor T2 has a high carrier mobility.

In addition, in the present embodiment, the first source 171a of the first transistor T1 and the first gate 151 of the first transistor T1 are not overlapped, and the first drain 171b of the first transistor T1 and the first gate 151 of the first transistor T1 are not overlapped. Therefore, the parasitic capacitance of the first transistor T1 is low so that the first transistor T1 is easy to operate.

The first transistor T1 having low parasitic capacitance and the second transistor T2 capable of providing high current input may be applied to various circuits to meet the demand for transistor characteristics in different circuit designs, which are illustrated below with reference to FIG. 2.

Figure 2:
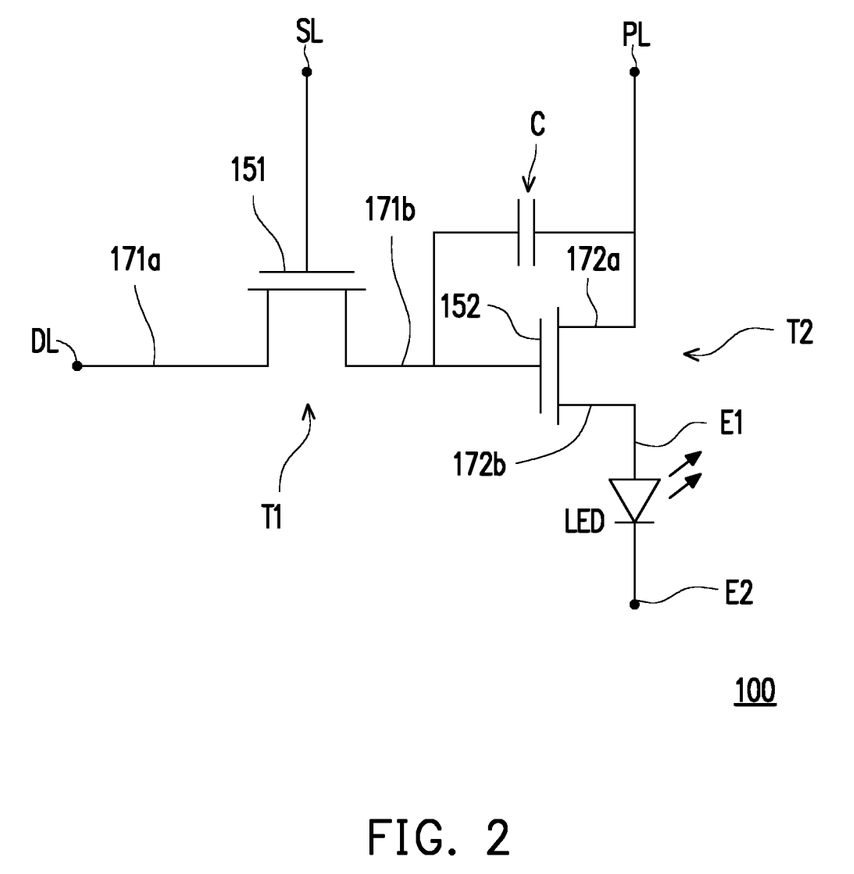
FIG. 2 shows a pixel driving circuit of a semiconductor substrate of an embodiment of the invention.

FIG. 2 shows a pixel driving circuit of a semiconductor substrate of an embodiment of the invention. Please refer to FIG. 1 and FIG. 2. The first transistor T1 and the second transistor T2 above may be applied to the pixel driving circuit of FIG. 2. Specifically, in the present embodiment, the semiconductor substrate 100 may further include a data line DL, a scan line SL, a power line PL, a storage capacitor C, a first electrode E1, and a second electrode E2. The first source 171a of the first transistor T1 is electrically connected to the data line DL. The first gate 151 of the first transistor T1 is electrically connected to the scan line SL. The first drain 171b of the first transistor T1 is electrically connected to the second gate 152 of the second transistor T2 and the storage capacitor C. The second source 172a of the second transistor T2 and the storage capacitor C are electrically connected to the power line PL. The second drain electrode 172b of the second transistor T2 is electrically connected to the first electrode E1. The second electrode E2 has a predetermined potential (such as, but not limited to, a ground potential).

In the present embodiment, the semiconductor substrate 100 may be used as a back plate of an active light-emitting diode display device. A light-emitting diode element LED may be transferred onto the semiconductor substrate 100, wherein the anode of the light-emitting diode element LED is electrically connected to the first electrode E1 electrically connected to the second drain 172b of the second transistor T2, and the cathode of the light-emitting diode element LED is electrically connected to the second electrode E2 having a predetermined potential. However, the invention is not limited thereto, and the semiconductor substrate 100 may also be applied to other types of display devices. For example, an organic electroluminescent layer may be sandwiched between the first electrode E1 and the second electrode E2, and the semiconductor substrate 100 may also be used as an active element array substrate of an organic electroluminescent display device.

Please refer to FIG. 1 and FIG. 2. It is worth mentioning that in the pixel driving circuit of FIG. 2, the first transistor T1 having low parasitic capacitance is used as a selective transistor, and the second transistor T2 that may provide a high current input is used as a driving transistor. Thereby, the first transistor T1 and the second transistor T2 may each display the characteristics thereof, thereby improving the overall performance of the pixel driving circuit.

It should be noted that the first transistor T1 and the second transistor T2 of the semiconductor substrate 100 are not limited to being applied only to the pixel driving circuit located in the active region. According to other embodiments, the first transistor T1 and the second transistor T2 may also be applied to a circuit located in a peripheral region, such as an integrated gate driving circuit or other peripheral circuits.

It should be mentioned here that, the following embodiments adopt the reference numerals of the embodiments above and a portion of the content thereof, wherein the same reference numerals are used to represent the same or similar devices and descriptions of the same technical content are omitted. The omitted portions are as described in the embodiments above and are not repeated in the embodiments below.

Figure 3:
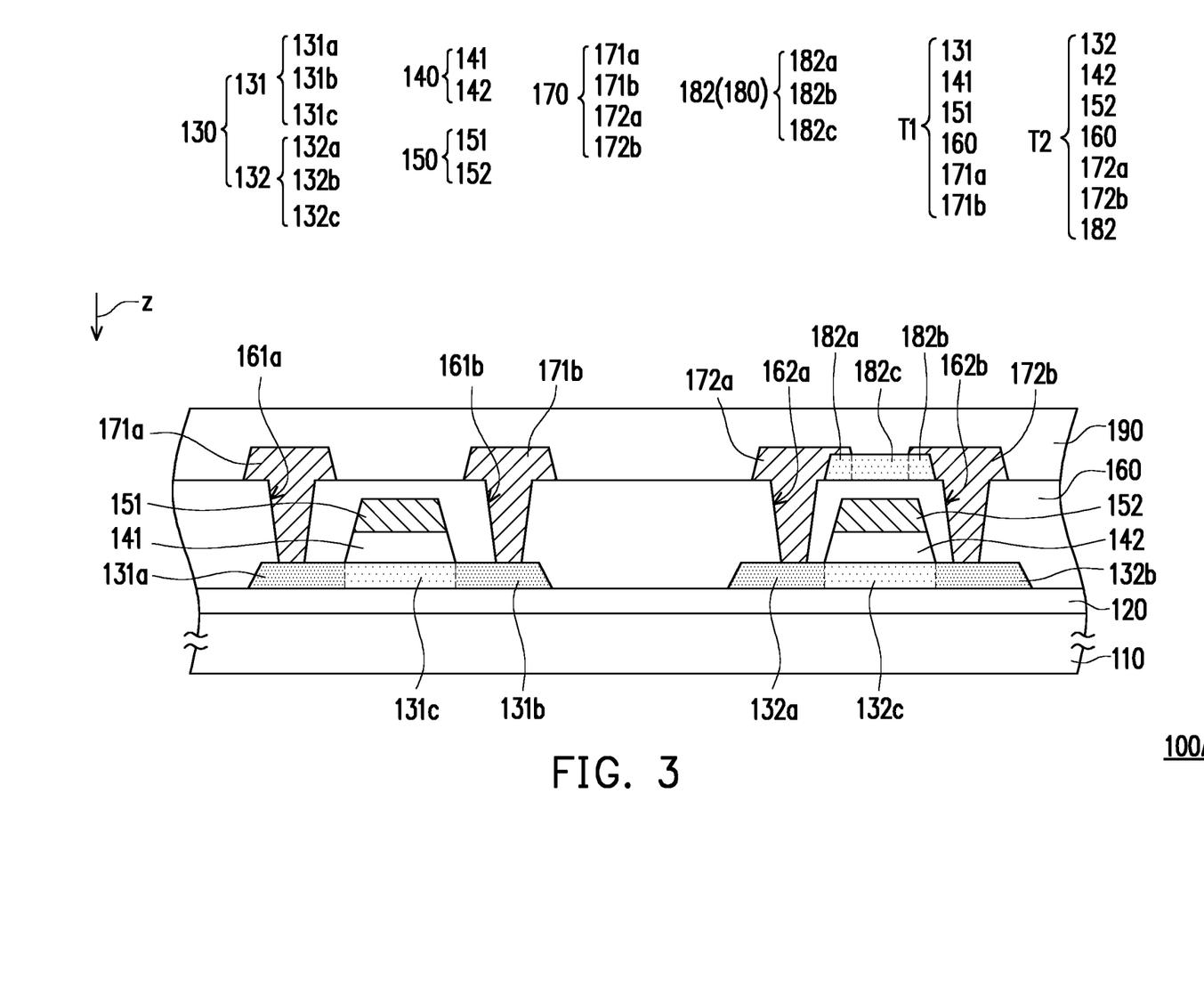
FIG. 3 is a cross-sectional view of a semiconductor substrate of another embodiment of the invention.

FIG. 3 is a cross-sectional view of a semiconductor substrate of another embodiment of the invention. A semiconductor substrate 100A of FIG. 3 is similar to the semiconductor substrate 100 of FIG. 1F. The difference between the two is that in the embodiment of FIG. 1F, the second conductive layer 170 is formed first and then the second metal oxide semiconductor layer 180 is formed, and the second metal oxide semiconductor layer 180 is disposed on the second conductive layer 170. In the embodiment of FIG. 3, the second metal oxide semiconductor layer 180 is formed first, and then the second conductive layer 170 is formed, and the second conductive layer 170 is disposed on the second metal oxide semiconductor layer 180.

The first transistor T1 and the second transistor T2 of FIG. 3 may also be applied to the pixel driving circuit of FIG. 2 or other circuits. Those having ordinary skill in the art should be able to implement the above according to the foregoing description and is not repeated herein.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor substrate, comprising:
a substrate;
a first metal oxide semiconductor layer disposed on the substrate, wherein the first metal oxide semiconductor layer comprises a first metal oxide semiconductor pattern and a second metal oxide semiconductor pattern;
a first insulating layer disposed on the first metal oxide semiconductor layer;
a first conductive layer disposed on the first insulating layer, wherein the first conductive layer comprises a first gate and a second gate;
a second insulating layer disposed on the first conductive layer;
a second conductive layer disposed on the second insulating layer, wherein the second conductive layer comprises a first source, a first drain, a second source, and a second drain, the first source and the first drain are each electrically connected to the first metal oxide semiconductor pattern of the first metal oxide semiconductor layer, and a first transistor comprises the first metal oxide semiconductor pattern, the first gate, the first source, and the first drain;
a second metal oxide semiconductor layer disposed on the second insulating layer, wherein the second metal oxide semiconductor layer comprises a third metal oxide semiconductor pattern, the second source is electrically connected to the second metal oxide semiconductor pattern of the first metal oxide semiconductor layer and the third metal oxide semiconductor pattern of the second metal oxide semiconductor layer, the second drain is electrically connected to the second metal oxide semiconductor pattern of the first metal oxide semiconductor layer and the third metal oxide semiconductor pattern of the second metal oxide semiconductor layer, a second transistor comprises the second metal oxide semiconductor pattern of the first metal oxide semiconductor layer, the second gate, the second source, the second drain, and the third metal oxide semiconductor pattern of the second metal oxide semiconductor layer, and the first drain of the first transistor is electrically connected to the second gate of the second transistor; and
a light-emitting diode element electrically connected to the second drain of the second transistor, wherein
the first source of the first transistor and the first gate of the first transistor are not overlapped, and the first drain of the first transistor and the first gate of the first transistor are not overlapped;
the second source of the second transistor and the second gate of the second transistor are partially overlapped, and the second drain of the second transistor and the second gate of the second transistor are partially overlapped.

2. The semiconductor substrate of claim 1, wherein the second metal oxide semiconductor pattern of the second transistor has a source region, a channel region, and a drain region, the source region of the second metal oxide semiconductor pattern is directly in contact with the second source, the drain region of the second metal oxide semiconductor pattern is directly in contact with the second drain, and the channel region of the second metal oxide semiconductor pattern is disposed between the source region of the second metal oxide semiconductor pattern and the drain region of the second metal oxide semiconductor pattern; the third metal oxide semiconductor pattern of the second transistor has a source region, a channel region, and a drain region, the source region of the third metal oxide semiconductor pattern is directly in contact with the second source, the drain region of the third metal oxide semiconductor pattern is directly in contact with the second drain, and the channel region of the third metal oxide semiconductor pattern is disposed between the source region of the third metal oxide semiconductor pattern and the drain region of the third metal oxide semiconductor pattern; the source region of the second metal oxide semiconductor pattern and the drain region of the second metal oxide semiconductor pattern are a plurality of modified regions, and the source region of the third metal oxide semiconductor pattern and the drain region of the third metal oxide semiconductor pattern are a plurality of intrinsic regions.

3. The semiconductor substrate of claim 1, wherein the second metal oxide semiconductor pattern of the second transistor has a source region, a channel region, and a drain region, the source region of the second metal oxide semiconductor pattern is directly in contact with the second source, the drain region of the second metal oxide semiconductor pattern is directly in contact with the second drain, and the channel region of the second metal oxide semiconductor pattern is disposed between the source region of the second metal oxide semiconductor pattern and the drain region of the second metal oxide semiconductor pattern; the third metal oxide semiconductor pattern of the second transistor has a source region, a channel region, and a drain region, the source region of the third metal oxide semiconductor pattern is directly in contact with the second source, the drain region of the third metal oxide semiconductor pattern is directly in contact with the second drain, and the channel region of the third metal oxide semiconductor pattern is disposed between the source region of the third metal oxide semiconductor pattern and the drain region of the third metal oxide semiconductor pattern; a resistivity of the source region of the third metal oxide semiconductor pattern is greater than a resistivity of the source region of the second metal oxide semiconductor pattern.

4. The semiconductor substrate of claim 1, wherein a carrier mobility of the second metal oxide semiconductor layer is greater than a carrier mobility of the first metal oxide semiconductor layer.

5. The semiconductor substrate of claim 1, wherein a material of the first metal oxide semiconductor layer is different from a material of the second metal oxide semiconductor layer.

6. The semiconductor substrate of claim 1, wherein the second metal oxide semiconductor layer is disposed on the second conductive layer.

7. The semiconductor substrate of claim 1, wherein the second conductive layer is disposed on the second metal oxide semiconductor layer.

8. The semiconductor substrate of claim 1, wherein a material of the second metal oxide semiconductor layer comprises indium tin zinc oxide.

9. The semiconductor substrate of claim 8, wherein a material of the first metal oxide semiconductor layer comprises indium gallium zinc oxide.

10. A semiconductor substrate, comprising:
a substrate;
a first transistor disposed on the substrate, wherein the first transistor has a first metal oxide semiconductor pattern, a first gate, a first source, and a first drain, and the first source and the first drain are each electrically connected to the first metal oxide semiconductor pattern; and
a second transistor disposed on the substrate, wherein the second transistor has a second metal oxide semiconductor pattern, a first insulating layer, a second gate, a second insulating layer, a second source, a second drain, and a third metal oxide semiconductor pattern, the first insulating layer is disposed on the second metal oxide semiconductor pattern, the second gate is disposed on the first insulating layer, the second insulating layer is disposed on the second gate, the second source, the second drain, and the third metal oxide semiconductor pattern are disposed on the second insulating layer, the second source and the second drain are each electrically connected to the second metal oxide semiconductor pattern, and the second source and the second drain are each electrically connected to the third metal oxide semiconductor pattern, wherein
the first drain of the first transistor is electrically connected to the second gate of the second transistor, and
the second metal oxide semiconductor pattern of the second transistor has a source region, a channel region, and a drain region, the source region of the second metal oxide semiconductor pattern is directly in contact with the second source, the drain region of the second metal oxide semiconductor pattern is directly in contact with the second drain, and the channel region of the second metal oxide semiconductor pattern is disposed between the source region of the second metal oxide semiconductor pattern and the drain region of the second metal oxide semiconductor pattern; the third metal oxide semiconductor pattern of the second transistor has a source region, a channel region, and a drain region, the source region of the third metal oxide semiconductor pattern is directly in contact with the second source, the drain region of the third metal oxide semiconductor pattern is directly in contact with the second drain, and the channel region of the third metal oxide semiconductor pattern is disposed between the source region of the third metal oxide semiconductor pattern and the drain region of the third metal oxide semiconductor pattern; the source region of the second metal oxide semiconductor pattern and the drain region of the second metal oxide semiconductor pattern are a plurality of modified regions, and the source region of the third metal oxide semiconductor pattern and the drain region of the third metal oxide semiconductor pattern are a plurality of intrinsic regions.

11. The semiconductor substrate of claim 10, wherein the first source of the first transistor and the first gate of the first transistor are not overlapped, and the first drain of the first transistor and the first gate of the first transistor are not overlapped; the second source of the second transistor and the second gate of the second transistor are partially overlapped, and the second drain of the second transistor and the second gate of the second transistor are partially overlapped.

12. The semiconductor substrate of claim 1, wherein a resistivity of the source region of the third metal oxide semiconductor pattern is greater than a resistivity of the source region of the second metal oxide semiconductor pattern.

13. The semiconductor substrate of claim 10, wherein a carrier mobility of the third metal oxide semiconductor pattern is greater than a carrier mobility of the first metal oxide semiconductor pattern.

14. The semiconductor substrate of claim 10, wherein a carrier mobility of the third metal oxide semiconductor pattern is greater than a carrier mobility of the second metal oxide semiconductor pattern.

15. The semiconductor substrate of claim 10, wherein a material of the third metal oxide semiconductor pattern is different from a material of the first metal oxide semiconductor pattern.

16. The semiconductor substrate of claim 10, wherein a material of the third metal oxide semiconductor pattern is different from a material of the second metal oxide semiconductor pattern.

17. The semiconductor substrate of claim 10, further comprising:

a light-emitting diode element electrically connected to the second drain of the second transistor.

18. The semiconductor substrate of claim 10, wherein the third metal oxide semiconductor pattern is disposed on the second source and the second drain.

19. The semiconductor substrate of claim 10, wherein the second source and the second drain are disposed on the third metal oxide semiconductor pattern.

20. The semiconductor substrate of claim 10, wherein a material of the third metal oxide semiconductor pattern comprises indium tin zinc oxide.

21. The semiconductor substrate of claim 20, wherein a material of the first metal oxide semiconductor pattern comprises indium gallium zinc oxide.

22. The semiconductor substrate of claim 20, wherein a material of the second metal oxide semiconductor pattern comprises indium gallium zinc oxide.

\* \* \* \* \*